United States Patent [19]
Casada

[11] Patent Number: 5,519,337
[45] Date of Patent: May 21, 1996

[54] MOTOR MONITORING METHOD AND APPARATUS USING HIGH FREQUENCY CURRENT COMPONENTS

[75] Inventor: Donald A. Casada, Knoxville, Tenn.

[73] Assignee: Martin Marietta Energy Systems, Inc., Oak Ridge, Tenn.

[21] Appl. No.: 145,538

[22] Filed: Nov. 4, 1993

[51] Int. Cl.⁶ .......................... G01R 31/02; G01R 23/16
[52] U.S. Cl. .................. 324/772; 324/76.11; 324/545
[58] Field of Search ........................... 324/158 MG, 177, 324/770, 772

[56] References Cited

U.S. PATENT DOCUMENTS

| | | | |
|---|---|---|---|
| 4,377,784 | 3/1983 | Saito et al. | 324/158 MG |
| 4,678,990 | 7/1987 | Bicknell et al. | 324/158 MG |
| 4,779,051 | 10/1988 | Grunewald et al. | 324/536 |
| 4,788,497 | 11/1988 | Katsumara | 324/177 |
| 4,808,932 | 2/1989 | Schulz, Jr. et al. | 324/545 |
| 4,890,058 | 12/1989 | Trenkler et al. | 324/772 |
| 4,965,513 | 10/1990 | Haynes et al. | 324/158 MG |
| 4,978,909 | 12/1990 | Hendrix et al. | 324/77 |
| 5,030,917 | 7/1991 | Kliman | 324/545 |
| 5,049,815 | 9/1991 | Kliman | 324/158 MG |
| 5,051,682 | 9/1991 | Sekiguchi | 322/99 |

*Primary Examiner*—Kenneth A. Wieder
*Assistant Examiner*—Barry C. Bowser
*Attorney, Agent, or Firm*—Edward A. Pennington; James M. Spicer; Harold W. Adams

[57] ABSTRACT

A motor current analysis method and apparatus for monitoring electrical-motor-driven devices. The method and apparatus utilize high frequency portions of the motor current spectra to evaluate the condition of the electric motor and the device driven by the electric motor. The motor current signal produced as a result of an electric motor is monitored and the low frequency components of the signal are removed by a high-pass filter. The signal is then analyzed to determine the condition of the electrical motor and the driven device.

19 Claims, 7 Drawing Sheets

MOTOR MONITORING METHOD AND APPARATUS USING HIGH FREQUENCY CURRENT COMPONENTS

This invention was made with Government support under contract DE-AC05-84OR21400 awarded by the U.S. Department of Energy to Martin Marietta Energy Systems, Inc. and the Government has certain rights in this invention.

FIELD OF THE INVENTION

The present invention relates generally to methods for monitoring electrical-motor-driven devices, and more particularly, to a method and apparatus utilizing high frequency components of the measured spectra produced by electrical-motor-driven devices. A high pass filter excludes from the monitored motor current frequencies below a predetermined threshold, typically several multiples of the line current, and at least one spectral peak frequency is correlated to at least one monitored condition. Observable changes in magnitude of the peak frequency indicate changes in the monitored condition.

BACKGROUND OF THE INVENTION

Electrical-motor-driven devices have found use in a wide variety of applications. Many of these applications require regular monitoring to ensure that the motor is properly functioning. Motor current spectrum analysis (MCSA) has been developed as an effective method for efficiently, reliably, and non-intrusively monitoring the condition of electrical-motor-driven devices. MCSA permits individuals to determine the operating condition of rotating equipment. The operating condition can then be related to the maintenance needs of the equipment.

MCSA is based upon the transduction of signals back to the power line via an electrical motor. For example, mechanical vibrations in alternating current (AC) rotating equipment are transduced back to the power line via the electrical motor. Additionally, electrical characteristics of the motor are transduced back to the power lines. These transduced signals are very small modulators to the large AC power line current.

The signals necessary for MCSA are typically provided by attaching a current transformer to a lead of the electrical motor. Once the signals are gathered, they are conditioned, sampled and analyzed in the frequency-domain with the Discrete Fourier Transform (DFT). Any periodic time-domain vibrations and fault data produced by the motor are displayed as peaks in the frequency spectra. However, the larger signal produced by the large AC power line current, and its harmonics, are also displayed in the frequency spectra at a magnitude that can be several orders of magnitude greater than the signals of interest. The spectra of motor current data for these large power line frequencies are expansive and Gaussian in nature when they are sampled by conventional methods. As a result, any anomalies or abnormalities having a frequency close to the frequency of the AC power line current are difficult to evaluate and precisely define.

All induction type electrical motors include two common features. First, each includes a stator which is a stationary element through which externally supplied current is passed. In addition, each motor includes a rotor which is a rotating element into which an electric current is induced. Common commercial motors create a magnetic field by passing electrical current around multiple stator slots. The magnetic field induces currents within rotor bars, contained in the rotor, which provide the electrical conduction path for the induced current.

As an individual rotor bar enters a stator pole's field of influence, the magnetic coupling of the stator and rotor changes. The resultant change in impedance seen by the stator produces a small change in the current flowing from the power supply to the stator. As a result, small high frequency signals are produced by the rotation of the rotor bars. These small high frequency signals modulate the large AC power line current.

Broken rotor bars are a common form of degradation/failure in electric motors. Rotor bars can fail from a variety of causes, including thermal, mechanical and chemical breakdown. In addition, manufacturing defects can result in imbalances in load sharing among the individual rotor bars.

Existing methods and apparatuses for monitoring rotor bars have relied solely on secondary indicators. For example, slip frequency magnitude has been used to detect rotor bar degradation. Slip, which is a measure of the difference between the rotating speed of the motor and its synchronous speed, has been measured by either magnetic fields in the vicinity of the motor or by overall current measurements (either in the raw or demodulated forms).

For example, U.S. Pat. No. 4,965,513, to Haynes et al., and U.S. Pat. No. 4,978,909, to Hendrix et al., disclose the use of spectral analysis to monitor electrical motors and the associated driven devices. Both methods focus on the low frequency content of the motor current, either by demodulating the overall current signal (Hendrix et al.) or by collecting synchronous data (i.e., synchronous to the AC electrical supply current which is a 60 Hz carrier with regard to the resultant signal produced by the motor current; see Haynes et al.). In the case of the synchronous data collection system, the existing practice is to sample the unfiltered data at a moderate frequency of 1920 Hz, thus limiting the ability of the system to observe high-frequency related phenomena.

Additionally, the existing techniques, such as measuring the energy content of slip sidebands of 60 Hz or slip magnitude in the demodulated motor current, are inherently limited by the dynamic range of the recording media. Further, the raw motor current slip magnitude has been shown to not always be a faithful indicator of rotor degradation.

U.S. Pat. Nos. 5,030,917 and 5,049,815, to Kliman disclose methods for monitoring rotor faults in induction motors by considering the current drawn by a motor. Specifically, Kliman discloses measuring characteristics of the current drawn when an electrical motor is started to determine rotor faults. For example, in U.S. Pat. No. 5,030,917 the drawn current is analyzed to determine dips in the starting motor current amplitude when the motor reaches approximately half speed. In contrast, U.S. Pat. No. 5,049,815 discloses the conversion of signals indicative of the drawn current to generate a frequency spectrum of the motor current. The frequency spectrum is then analyzed to determine rotor fault and slip frequency values. Briefly, the signals from the drawn current are fed through a low pass/amplifier to remove unnecessary high frequency components. The signals are then studied to determine the current peaks and sidebands associated with fundamental motor current frequency. From these studies, one is able to monitor incipient rotor faults.

Other methods and apparatuses for monitoring electrical motors are disclosed by Saito et al. (U.S. Pat. No. 4,377,784), Bicknell et al. (U.S. Pat. No. 4,678,990), Schulz, Jr. et al. (U.S. Pat. No. 4,808,932), and Sekiguchi (U.S. Pat. No. 5,051,682).

While these methods can give secondary indications of rotor bar condition in some cases, they are not foolproof, and can be significantly influenced by other parameters. For instance, in the case of the raw current measurements the magnitude of the slip sidebands have been used. However, the slip sidebands are significantly smaller than the carrier (e.g., one-thousandth of the current load), and attempts to measure variations are inherently limited by the dynamic range of the measuring equipment. In the case of demodulated motor current, which certainly offers improved resolution of the slip sidebands, slip is often not detectable due to the presence of the large mechanical loads which confuse the picture.

In summary, several of the prior techniques rely upon secondary considerations rather than measuring the primary source itself. A need exists for an improved method for monitoring the condition of an operating electrical-motor-driven device.

SUMMARY OF THE INVENTION

An object of the present invention is to provide a monitoring method and apparatus capable of utilizing the high frequency components of the spectra produced by electrical-motor-driven devices, such that instantaneous speed and other important characteristics of the motor and driven device are detectable.

Another object of the present invention is to provide a relatively simple, convenient, and reliable method and apparatus for monitoring the condition of electrical-motor-driven devices.

Another object of the present invention is to provide a method and apparatus for monitoring machines, other than motors, and utilizing a signal which varies in accordance with machine operation, such as Hall Effect signal, an accelerometer, etc.

Still another object of the present invention is to provide a method and apparatus for monitoring a motor in which the number of rotor bars can be determined in an induction motor while the motor is operating.

These and other objects are met by providing a method of monitoring a machine having an electrical signal which varies during machine operation, which includes excluding from the electrical signal all frequencies below a threshold corresponding to at least a first harmonic of the line frequency (i.e., 60 Hz in the U.S.), correlating at least one characteristic of the electrical signal to at least one monitored condition, and correlating changes in magnitude of the at least one characteristic to changes in the monitored condition.

Other objects, advantages and salient features of the invention will become apparent from the following detailed description, which taken in conjunction with the annexed drawings, discloses the preferred but non-limiting embodiment of the invention.

DETAILED DESCRIPTION OF THE PREFERRED EMBODIMENT

Figure 1:
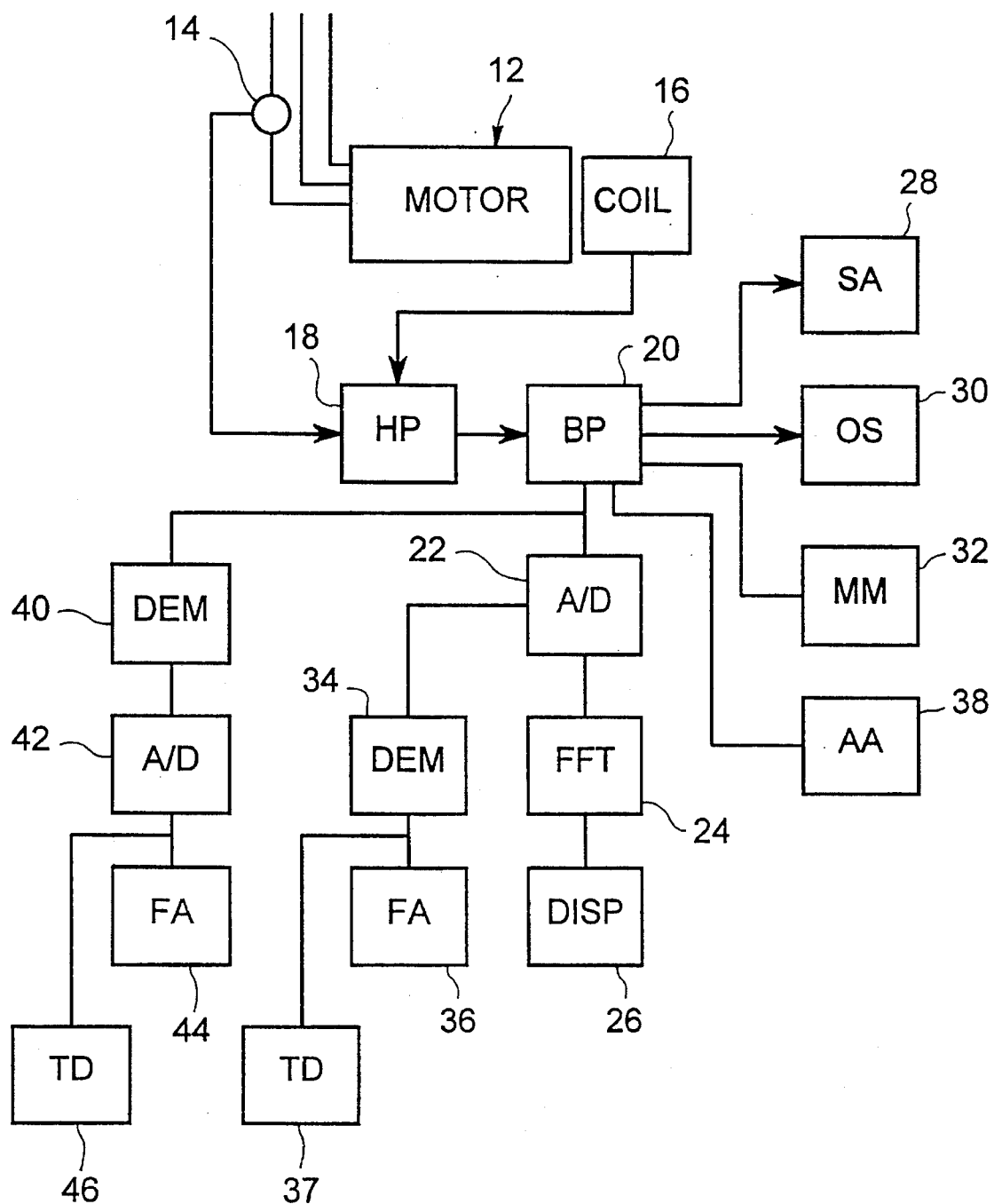
FIG. 1 is a schematic view of a preferred embodiment of the present invention.

Referring to FIG. 1, an apparatus 10 for monitoring operation of an electric motor 12 uses a current transformer 14 to sense the power line current supplied to the motor 12. The transformer 14 produces an electrical signal which varies in accordance with machine operation and motor condition. Other suitable means for producing a varying electrical signal may be employed instead of, or in addition to, the transformer 14, such as a coil 16 juxtaposed with the motor 12 in the influence of its magnetic field.

The current signal from the transformer 14 is delivered to means for excluding from the electrical signal all frequencies except those above a predetermined threshold value. In the illustrated embodiment, this is accomplished with a high pass (HP) filter 18. The same function could be performed by a notch filter(s) which suppress line frequency (and, as desired, harmonics thereof).

Figure 1A:
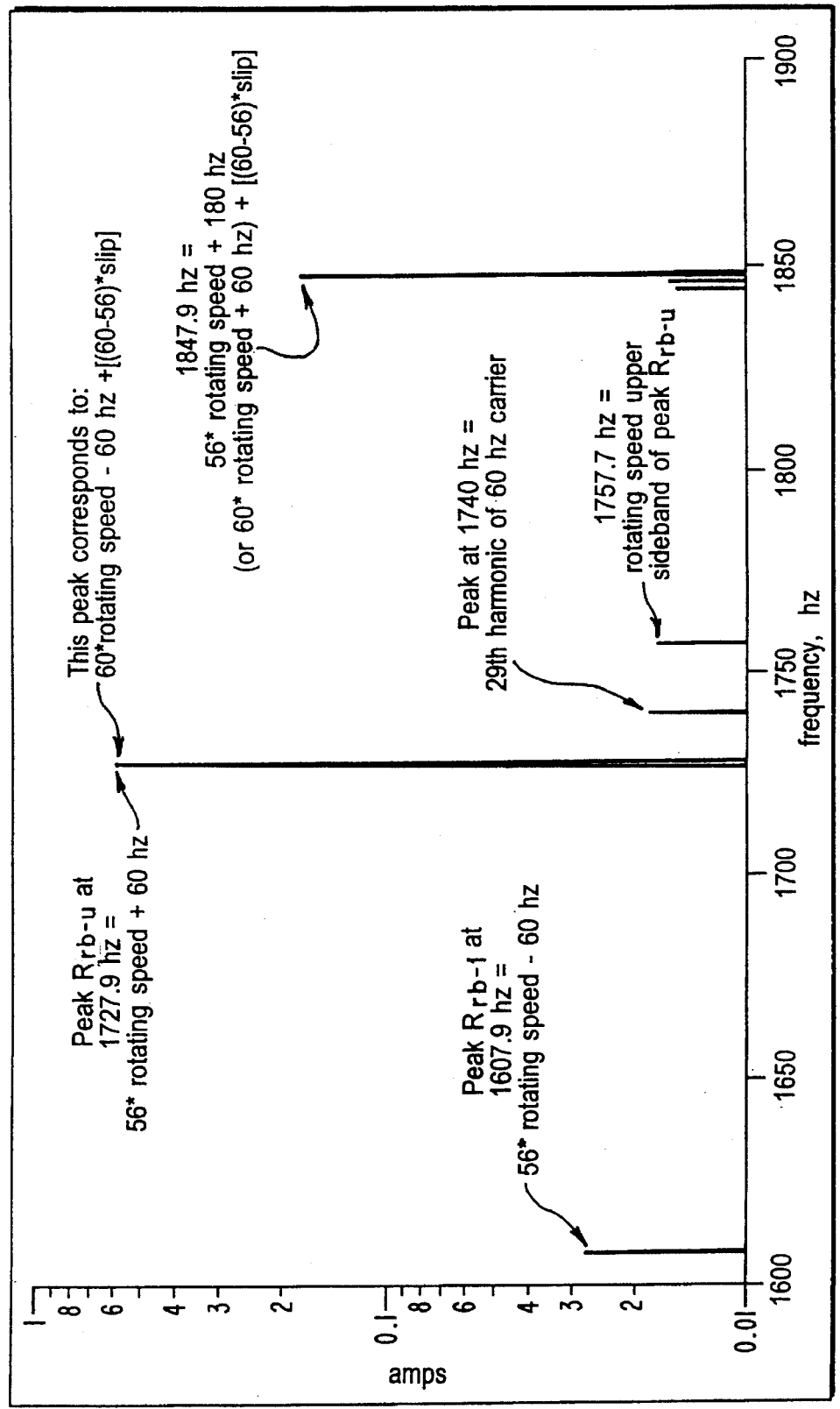
FIG. 1(a) is a frequency spectra produced in accordance with the present invention.

The frequency response of the high pass filter 18 is selected to be at a level at least at or above the first harmonic of the line frequency. In one particularly preferred embodiment, the motor 12 is a four pole motor with fifty-six (56) rotor bars. Each rotation of the rotor results in (56) modulations of the 60 Hz field present in the stator windings (for a 60 Hz line current). When a small signal (such as that associated with the (56) rotor bars modulates a large carrier (the 60 Hz line frequency), there appear in the frequency spectrum 60 hz sidebands of the modulating frequency. In the case of a motor which is rotating at 29.784 Hz, for example, the rotor bar rotation rate is (56)×29.784=1,667.9 Hz. If the motor current frequency spectrum is reviewed it will be found that spectral peaks at 1,607.9 Hz (1,667.9 Hz–60 Hz) and 1,727.9 hz (1,667.9 Hz+60 hz) exist. For a graphical representation, see FIG. 1(a). These peaks are strictly related to the rotor bar rotational rate.

Other mechanical and/or electrical loads which modulate the motor current will result in similar sidebands. In addition, integer multiples of these loads will exist. Frequencies where common multiples are in close proximity (for instance where a rotor bar rotation rate multiple is near a stator slot x rotating speed multiple), synergistic interaction occurs, resulting in greater energy in that particular frequency band.

The use of the high pass filter 18 permits consideration of only that portion of the spectrum associated with a particular multiple of the rotation rate, so that degradation of the rotor bars or other components can be much more readily perceived than by considering the full spectrum.

Once the area of interest in the frequency spectrum is known, a band pass (BP) filter 20 can be used to enhance resolution. After bandpass filtering, a monitored condition can be determined in a variety of ways. In one, the filtered signal is digitized with an analog-to-digital (A/D) converter 22, and the digitized data is converted from a time domain to frequency domain via fast Fourier transform (FFT) 24. Other time-to-frequency domain transforms may be used instead of the FFT. The FFT 24 can be performed using a standard personal computer (PC) with data acquisition software, including the transform algorithms. A display 26, such as the CRT of the PC, can be used to produce frequency domain spectra as shown in FIGS. 2a–2c.

Alternatively, the conditioned signal can be delivered to a spectrum analyzer (SA) 28 capable of producing visually readable spectra, with peak frequencies and/or sidebands thereof correlating to monitored conditions. An oscilloscope 30 could also be used to produce a visually readable indication of motor condition and/or operation. A further alternative would be to employ a multimeter 32. A further alternative would be to take the digitized signal and feed it to a digital demodulator (DEM) 34, which for example produces r.m.s. values over a finite time period. The demodulator 34 output can then be visualized by a frequency analyzer 36, or may be analyzed in the time domain by a suitable device 37. A further alternative is to use an analog demodulator 40, which demodulates the analog signal, and an analog-to-digital converter (A/D) 42. The digitized signal is then analyzed with a frequency analyzer 44 or time domain device 46. Controlled tests on small squirrel cage fan motors were run to demonstrate the invention. Frequencies below a threshold value were excluded by setting the frequency response of the high pass filter 18 at 1,000 kHz. Since frequencies of concern will be occurring in the vicinity of 4,000 kHz, a stereo equalizer was used as the band pass filter 20 to enhance the 4 kHz zone while suppressing other frequency zones. FIG. 2a represents the spectrum generated by the FFT 24 as displayed at display 26. FIG. 2b shows the spectrum generating after one rotor bar was degraded or broken, while FIG. 2c shows the spectrum for two broken rotor bars. A correlation can be made between the growing magnitude of the spectral peak frequency and degradation of the motor. A baseline is established by monitoring a motor when it is in new condition.

Figure 2A:
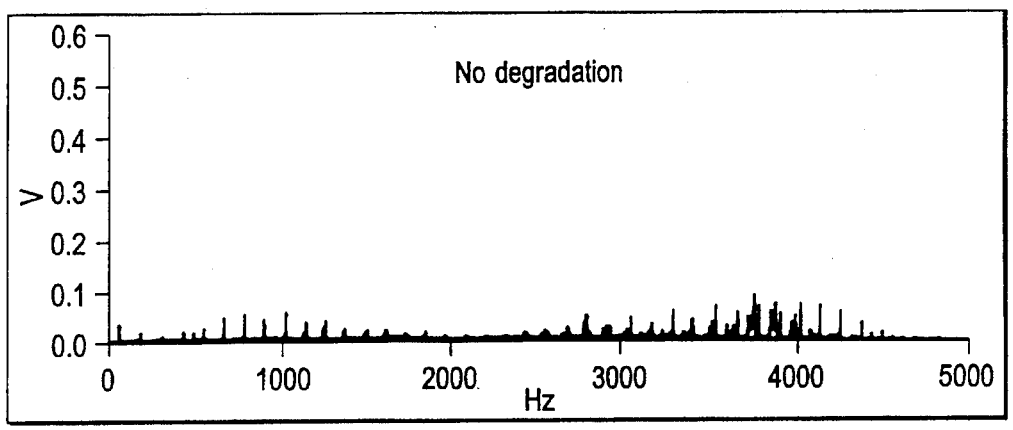
FIGS. 2a through 2c are frequency spectra of a motor, showing in sequence a normal condition, a condition of one degraded rotor bar and a condition of two degraded rotor bars, as monitored in accordance with the present invention.
Figure 2B:
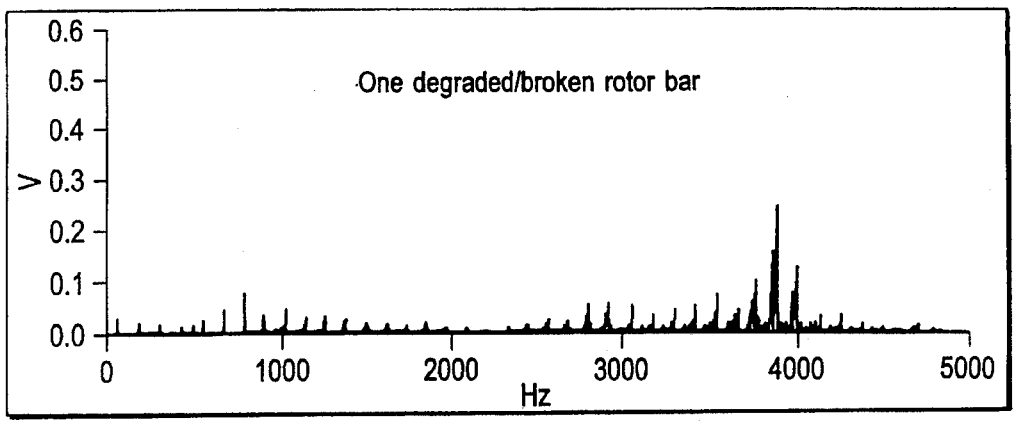
Figure 2C:
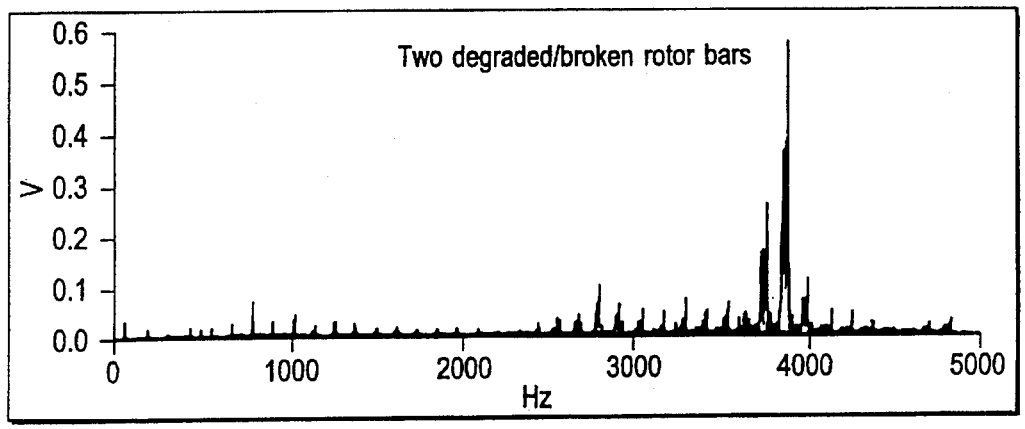

The data acquired in FIGS. 2a–2c was based on the fans removed from the shaft, i.e., at no-load conditions. The growing peak occurs in the vicinity of three times rotor bars times running speed (sixty-six times running speed) and four times stator slots times running speed (sixty-four times running speed).

Figure 3A:
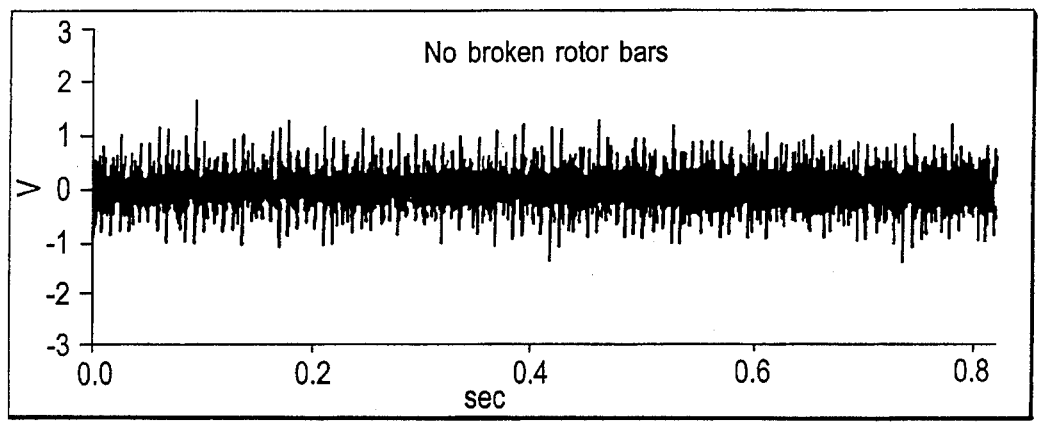
FIGS. 3a through 3c are time domain waveforms of a motor current signal for the motor tested in FIGS. 2a–2c.
Figure 3B:
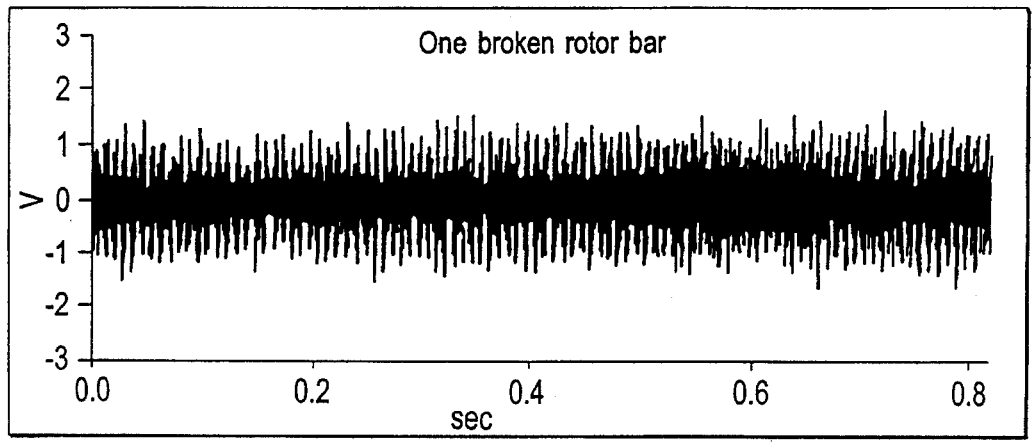
Figure 3C:
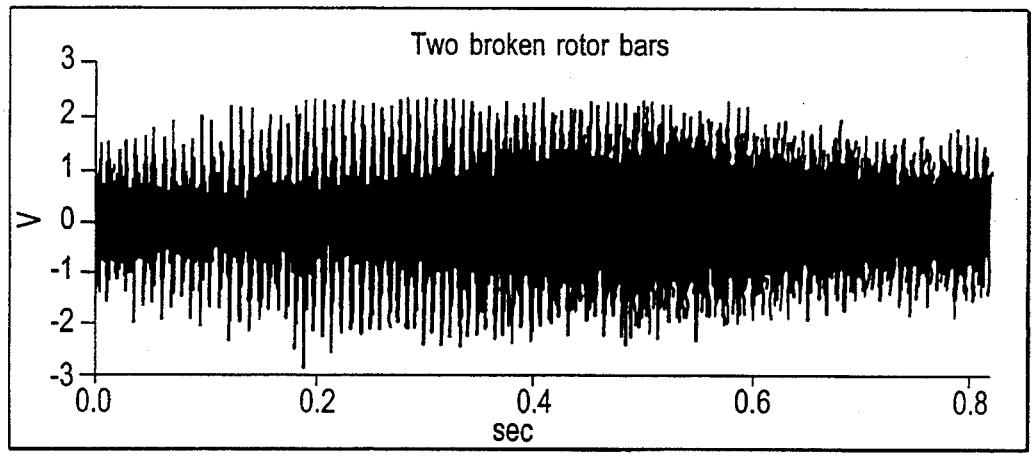

The same data produced in FIGS. 2a–2c in the frequency domain can be visualized in the time domain as shown in FIGS. 3a–3c. A visual indication of motor degradation can be seen as the magnitude of the signal grows with each broken bar. The wave forms of FIGS. 3a–3c are similar to audio signals produced by an audio amplifier (AA) 38, which could be used to listen to the filtered signal. An increasing audible noise would indicate increasing degradation.

By considering only that portion of the spectrum associated with a particular multiple of the rotation rate, the method and apparatus of the present invention will facilitate monitoring of the degradation of the rotor bars, or other components, in a more efficient and reliable manner than where the complete frequency spectrum is analyzed.

Figure 4A:
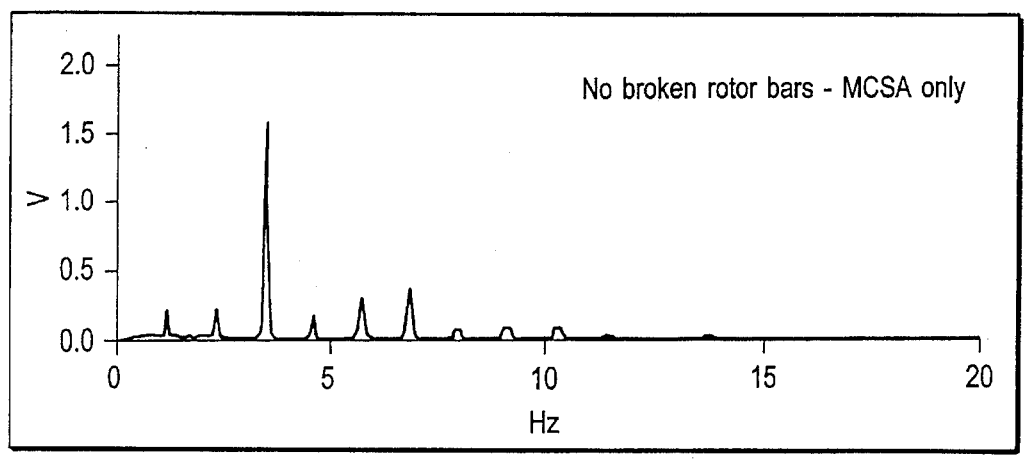
FIGS. 4a through 4c are frequency spectra of the conditions used in FIGS. 2a through 2c, but using conventional MCSA techniques.
Figure 4B:
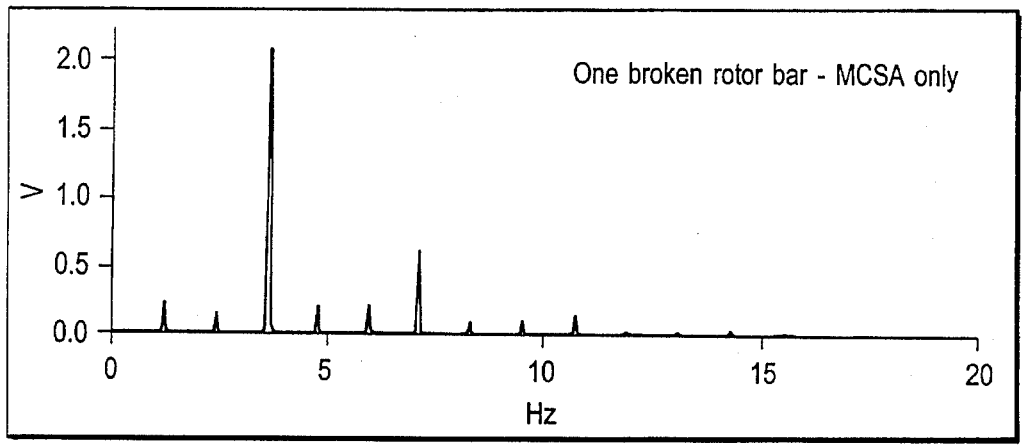
Figure 4C:
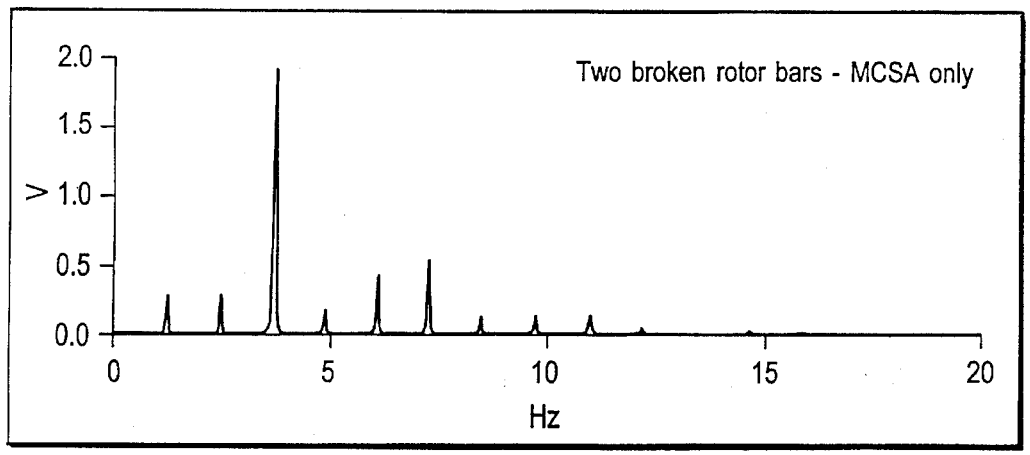

In contrast, FIGS. 4a through 4c disclose frequency spectra of the same fans tested to produce the spectra of FIGS. 2a through 2c, with the exception that the spectra of FIGS. 4a through 4c were based only upon conventional MCSA. FIG. 4a shows the spectrum for a fan having no rotor bar degradation, FIG. 4b shows the spectrum for a fan having one degraded/broken rotor bar, and FIG. 4c shows the spectrum for a fan having two degrade/broken rotors. The lack of a relationship between slip-pole magnitude and rotor degradation is readily apparent from these figures.

By monitoring the instantaneous current flow and by carefully analyzing the high frequency spectral content in accordance with the subject invention, the motor's instantaneous running speed, the number of functional rotor bars, and other important characteristics of the motor and driven device can be detected.

The ability to measure speed instantaneously provides the ability to monitor slight changes in the speed which can be used as an indication of overall motor health and load stability. For instance, in the case of centrifugal pumps, the load imposed upon the pump rotating element is not constant, but is comprised of both constant and discrete components. For example, as each impeller vane passes a cutwater or diffuser vane, a slight load increase occurs. The increase in load results in a very slight, short duration, speed reduction. This speed change is very slight, but it is detectable if a signal at many times running speed can be acquired.

Other, more dramatic speed changes occur in response to larger load changes (e.g., changes in the overall flow rate). The capability for measuring speed both instantaneously and more globally provides the ability to see the extent of stability of the driven process (such as pump flow), which is in turn, important in understanding causes of driven device or overall system problems. An important aspect of the subject invention involves the ability to count the number of rotor bars, even if the number of rotor bars is unknown prior to testing the electrical-motor-driven device. More specifically, rotor bar rotation sidebands occur not only at ±60 Hz (i.e., line frequency) from the rotor bar times rotating speed but also at odd harmonics of the line frequency, for example ±180 Hz, ±300 Hz, etc. Other sidebanding occurs that is motor-related, for example, rotating speed sidebands and slip-pole sidebands are common features.

The present invention is capable of monitoring all induction motor driven devices in addition to squirrel cage motors, including (but not limited to) electric motor driven pumps, fans, compressors, pulverizers, and a variety of small shop motors, including those powering bench grinders, table saws, and planer-joiners.

It has been found that the higher frequency content of the motor current spectrum provides dramatically cleaner indications of the motor speed and slip. For example, by high-pass filtering data, and then demodulating it (with traditional MCSA or other demodulation means), the fundamental slip peak and multiple harmonics are clearly indicated for some devices where traditional MCSA was unable to identify the fundamental slip peak. This limitation appears to be primarily due to the magnitude of other signals in the spectrum.

Figure 5A:
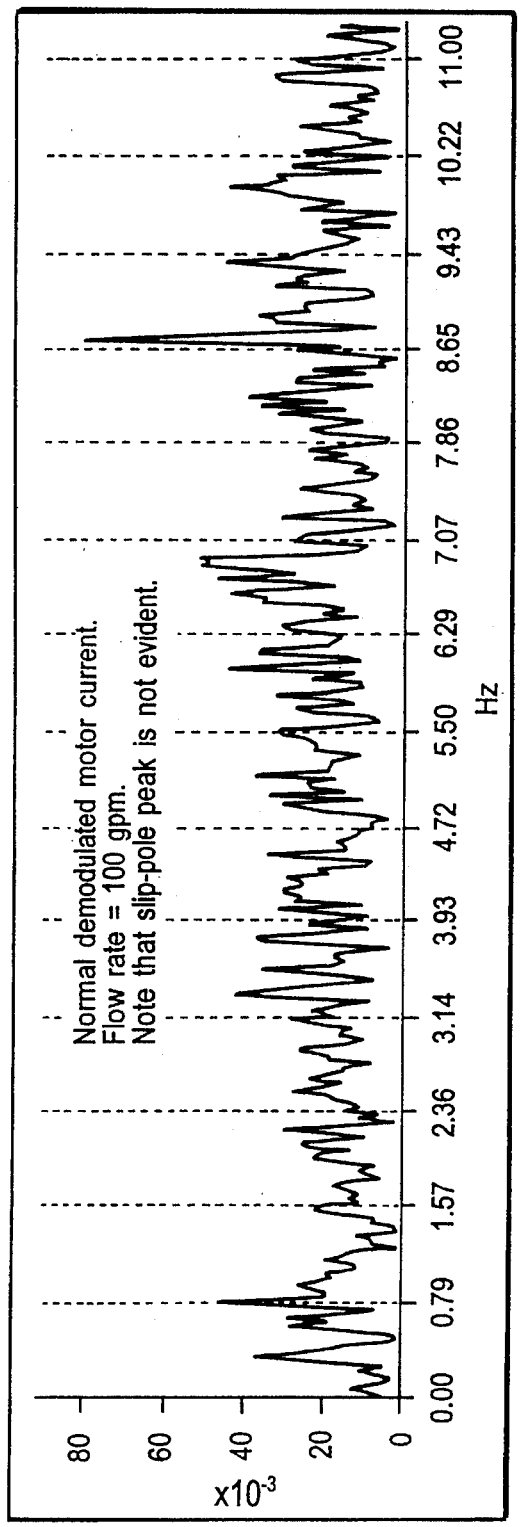
FIGS. 5a and 5b are contrasting frequency spectra of demodulated motor current signals.
Figure 5B:
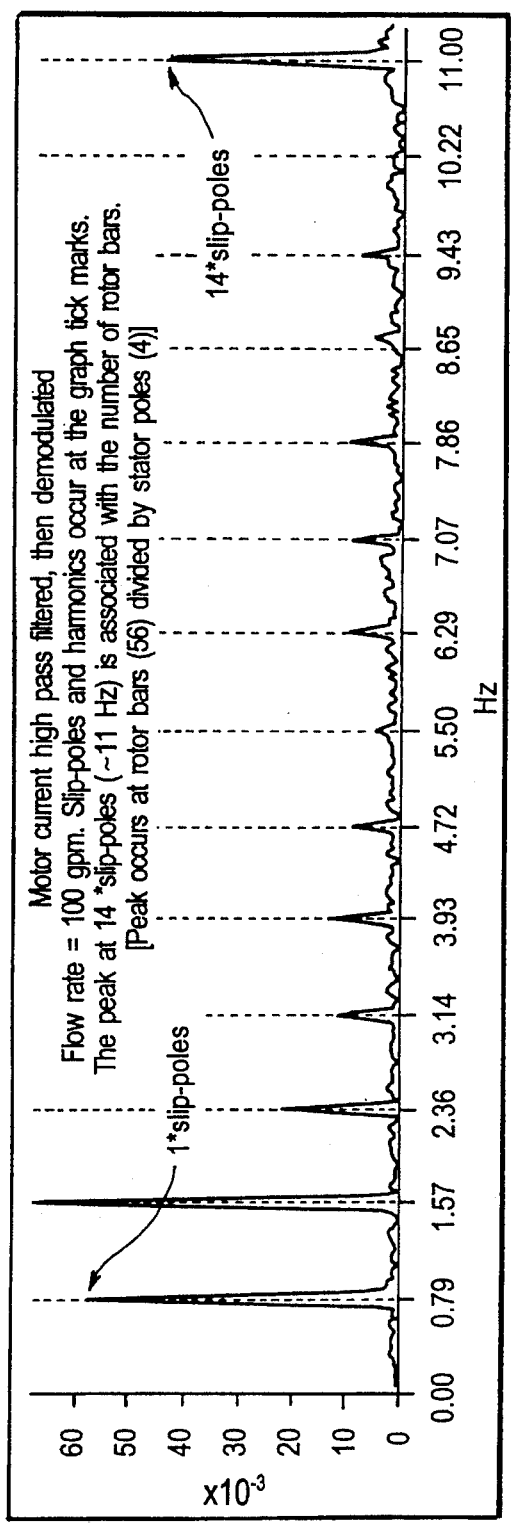

FIGS. 5a and 5b demonstrate the limitations of conventional MCSA discussed above. FIG. 5a shows the frequency spectrum for a motor current signal demodulated by conventional MCSA, while FIG. 5b shows the frequency spectrum for a motor current signal that has been high-pass filtered and then demodulated with demodulator 34. With regard to FIG. 5a the slip-pole peak is not evident, whereas FIG. 5b show the slip-pole peaks, and associated harmonics, at the graph tick marks. Specifically, the peak at 14×slip-poles (approximately 11 Hz) is associated with the number of rotor bars (i.e., the peak occurs at the number of rotor bars (56) divided by the number of stator poles (4)).

FIGS. 5a and 5b are based upon data collected from a Public Service Electric & Gas Test Facility pump. The pump was powered by a 50 hp motor, and produced a flow rate of 100 gallons/minute.

Consequently, the present invention, which combines traditional MCSA with additional signal processing before demodulation, yields improved insight into both electrical motors and associated motor driven devices. Additionally, frequency demodulation at selected higher frequencies, such as 60 Hz sidebands of multiples of the rotor bar rotation rate, permits frequency modulation of the time domain signals associated with components of electrical-motor-driven devices, as well as the rotor bars themselves. As a result, the ability to discriminate the extent to which individual components of electrical-motor-driven devices effect the operation of the devices is enhanced. For example, pump vane passing frequency (several times running speed) both amplitude modulates and frequency modulates the motor current. The extent of vane-passing frequency modulation of higher frequency components would indicate the extent of individual vane mechanical loading. The stability of the machine can be deduced by considering the frequency stability of specific speed-related peaks, as shown in FIGS. 6a through 6c.

Figure 6A:
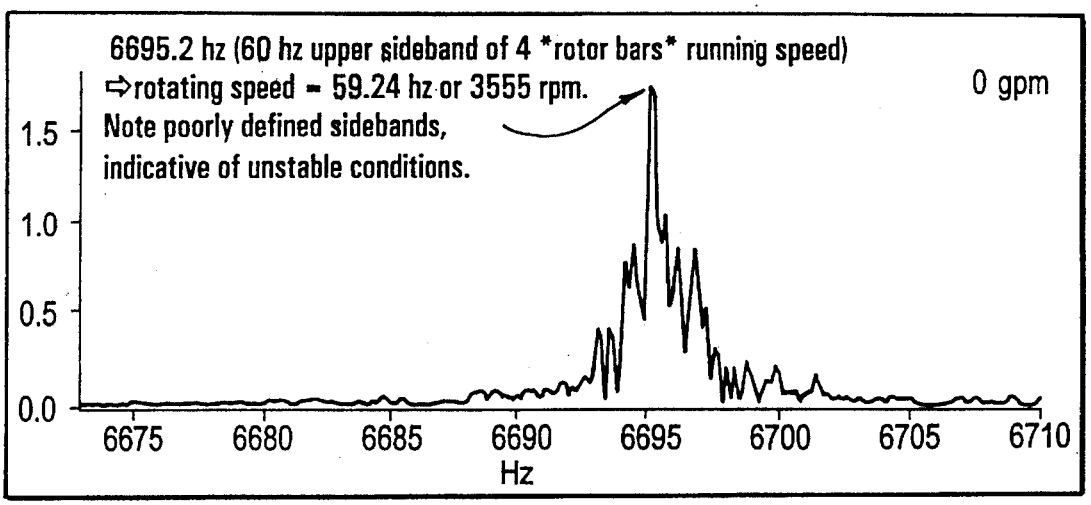
FIGS. 6a through 6c are frequency spectra for pumps operating at various pumping rates.
Figure 6B:
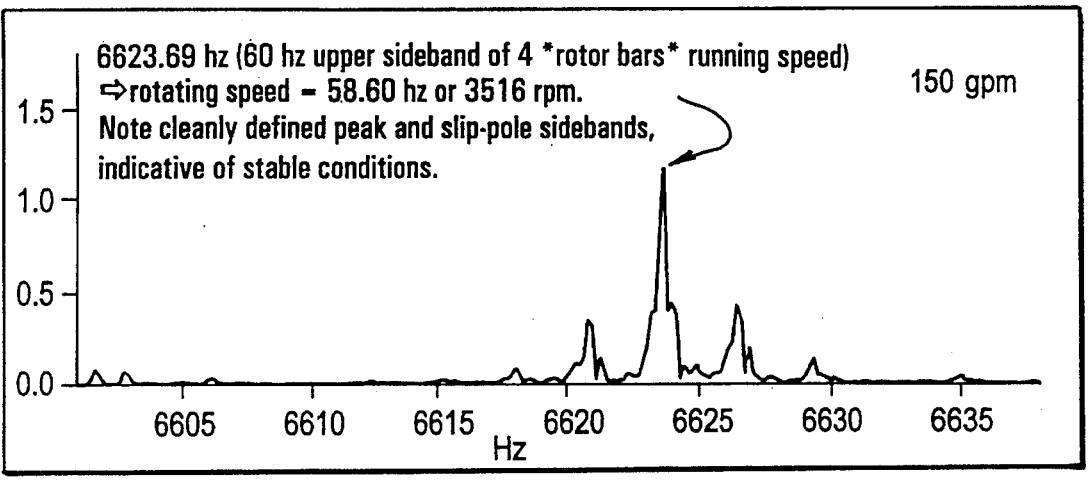
Figure 6C:
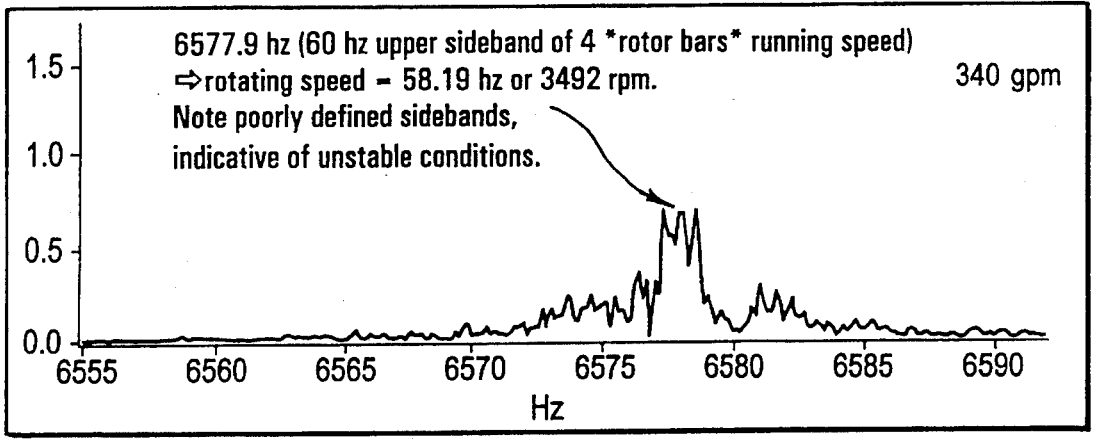

FIGS. 6a through 6c show the effect of changing pump flow on the stability of the pump and motor. Specifically, FIG. 6b shows the frequency spectrum where the pump is at a flow rate for which the velocity profiles within the pump are stable. The pump is running at 150 gallons/minute and a peak at 6623.69 hz (60 Hz upper sideband of 4×rotor bars×running speed, where the rotating speed is 58.60 hz) is evident in the frequency spectrum. The spectrum includes clearly defined peak and slip-pole sidebands, which are indicative of a stable condition. In contrast, FIGS. 6a and 6c show the pump in an unstable condition. FIG. 6a shows a frequency spectrum for the pump at 0 gallons/minute, while FIG. 6b shows a frequency spectrum for the pump at 340 gallons/minute. Both spectra include poorly defined sidebands that are indicative of unstable conditions.

Although the subject invention is directed toward the use of motor current as the sensed signal, the subject invention would also achieve its intended results by analyzing magnetic field measurements in the vicinity of the motor. When similar processing is applied, measurement of the magnetic field yields spectral results similar to those achieved when the electrical current signal is measured. Consequently, the instantaneous running speed, numbers of rotor bars, etc. can be determined by analyzing the magnetic field. Since it is often more convenient to monitor the magnetic field in the vicinity of some equipment, than to monitor motor current, this capability is an excellent complement to the analysis of the electrical current signal. The magnetic field can be measured by use of either ac- or dc-coupled devices, such as the coil 16 (FIG. 1) or a gaussmeter.

The subject invention can be implemented as a totally computerized package, implemented jointly with existing demodulation techniques, or fully developed into a modular package for direct field use. For example, the sounds synthesized from conditioned motor current data have been shown to be a potentially simple means for indicating rotor degradation. Additionally, the subject method and apparatus are not limited to motors, but could be applied to a variety of other power consuming components. Further, the subject method and apparatus are not limited to studying the modulations of the AC power line current produced by the rotation of the rotor bars. Rather any signal produced within the scope of the subject invention (such as stator slot-related modulations) could be studied as it modulates the AC power line current.

While a preferred embodiment has been shown and described, it will be understood that it is not intended to limit the disclosure, but rather it is intended to cover all modifications and alternate methods and apparatuses falling within the spirit and scope of the invention as defined in the appended claims or their equivalents.

What is claimed is:

1. A method of monitoring a machine having an electrical current signal which varies during machine operation, comprising the steps of:

excluding from the electrical current signal all frequencies below a certain threshold corresponding to at least a first harmonic of power line frequency, wherein the machine is an electric motor having a stator and a rotor, and the electrical current signal is a motor current signal resulting from the operation and condition of at least one of the rotor and stator of the electric motor, the motor current signal including a small high frequency component which modulates a large low frequency component;

correlating at least one characteristic of the electrical current signal to at least one monitored condition; and correlating changes in magnitude of the at least one characteristic to changes in the monitored condition.

2. A method according to claim 1, wherein the excluding step comprises filtering the motor current signal with one of a high pass filter and a notch filter to minimize the large low frequency component.

3. A method according to claim 2, further comprising demodulating the motor current signal after high pass filtering.

4. A method according to claim 2, further comprising the step band pass filtering the motor current signal after high pass filtering.

5. A method according to claim 2, further comprising digitizing the electrical current signal after high pass filtering, and performing a fast Fourier transform on the digitized signal to produce a frequency domain spectrum, wherein the characteristic of the electrical current signal is a peak frequency or sideband thereof.

6. A method according to claim 5, further comprising demodulating the electrical current signal after digitizing.

7. A method according to claim 5, further comprising analog-demodulating the electrical current signal and then digitizing the demodulated signal.

8. A method according to claim 1, wherein the step of correlating changes in magnitude of the at least one characteristic comprises listening to the electrical current signal with an audio amplifier.

9. A method according to claim 2, further comprising digitizing the electrical current signal after high pass filtering, and producing a time waveform on the digitized signal to produce a time domain spectrum, wherein the characteristic of the electrical current signal is amplitude.

10. A method according to claim 2, wherein the high-pass filter removes all frequencies at line current frequency and significant harmonics thereof.

11. A method of monitoring an electric motor-driven machine comprising the steps of:

producing a power line current signal which varies during machine operation;

excluding from the current signal all frequencies below a threshold corresponding to at least a first harmonic of line frequency;

correlating at least one characteristic of the current signal to at least one monitored condition; and correlating changes in magnitude of the at least one characteristic to changes in the monitored condition.

12. An apparatus for monitoring a machine having an electrical current signal which varies during machine operation, comprising:

means for excluding from the electrical current signal all frequencies below a threshold corresponding to at least a first harmonic of power line frequency, wherein the electrical current signal is a motor current signal resulting from the operation of the machine, the motor current signal including a small high frequency component which modulates a large low frequency component;

means for correlating at least one characteristic of the electrical current signal to at least one monitored condition; and means for correlating changes in magnitude of the at least one characteristic to changes in the monitored condition.

13. An apparatus according to claim 12, wherein the means for excluding comprises a high pass filter operable to filter the motor current signal and thus minimize the large low frequency component.

14. An apparatus according to claim 13, further comprising means for demodulating the motor current signal after high pass filtering.

15. An apparatus according to claim 13, further comprising means for band pass filtering the motor current signal after high pass filtering.

16. An apparatus according to claim 13, further comprising means for digitizing the electrical current signal after high pass filtering, and means for performing a fast Fourier transform on the digitized signal to produce a frequency domain spectrum, wherein the characteristic of the electrical current signal is a peak frequency or sideband thereof.

17. An apparatus according to claim 15, further comprising means for demodulating the electrical current signal after digitizing.

18. An apparatus according to claim 12, wherein the means for correlating changes in magnitude of the at least one characteristic comprises audio amplifier means for listening to the electrical current signal.

19. An apparatus according to claim 14, further comprising means for digitizing the electrical current signal after high pass filtering, and means for producing a time waveform on the digitized signal to produce a time domain spectrum, wherein the characteristic of the electrical current signal is amplitude.

* * * * *